(12) United States Patent
Kamiya

(10) Patent No.: US 6,268,783 B1
(45) Date of Patent: Jul. 31, 2001

(54) PRINTED CIRCUIT BOARD INCLUDING SIGNAL TRANSMISSION LINE CAPABLE OF SUPPRESSING GENERATION OF NOISE

(75) Inventor: Hiroshi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/210,841

(22) Filed: Dec. 15, 1998

(30) Foreign Application Priority Data

Dec. 16, 1997 (JP) .................................................. 9-346808

(51) Int. Cl.⁷ ...................................................... H01P 3/08
(52) U.S. Cl. .............................................. 333/238; 333/246
(58) Field of Search ................................. 333/238, 246, 333/33, 204

(56) References Cited

U.S. PATENT DOCUMENTS 4,090,155 * 5/1978 Tateno et al. ....................... 333/213

5,473,281 * 12/1995 Honjo ..................................... 333/33

FOREIGN PATENT DOCUMENTS

| 3-253923 | 11/1991 | (JP) . |
| 404288702 A | * 10/1992 | (JP) ..................................... 333/204 |
| 6-35582 | 2/1994 | (JP) . |

* cited by examiner

*Primary Examiner*—Robert Pascal
*Assistant Examiner*—Kimberly E Glenn
(74) *Attorney, Agent, or Firm*—Sughrue, Mion, Zinn, Macpeak & Seas, PLLC

(57) ABSTRACT

In a printed circuit board including a signal transmission line, the signal transmission line is formed by first, second and third connection patterns connected in series, and the width of the second connection pattern is smaller than that of the first and second connection patterns.

3 Claims, 4 Drawing Sheets

PRINTED CIRCUIT BOARD INCLUDING SIGNAL TRANSMISSION LINE CAPABLE OF SUPPRESSING GENERATION OF NOISE

BACKGROUND OF THE INVENTION

1. Field of the Invention

The present invention relates to a printed circuit board suitably used for transmitting high frequency signals therethrough.

2. Description of the Related Art

In a prior art printed circuit board, in order to suppress the generation of noise in signal transmission lines, one or more terminating resistors are connected to each of the signal transmission lines (see JP-A-6-35582).

In the above-mentioned prior art printed circuit board, particularly, for high frequency signals, however, since the number of terminating resistors is increased and the area of the printed circuit board is limited, such terminating resistors cannot completely be provided in the printed circuit board, so that they are insufficient to suppress the generation of noise.

SUMMARY OF THE INVENTION

It is an object of the present invention to provide a printed circuit board capable of suppressing the generation of noise without terminating resistors.

According to the present invention, in a printed circuit board including a signal transmission line, the signal transmission line is formed by first, second and third connection patterns connected in series, and the width of the second connection pattern is smaller than that of the first and third connection patterns.

Also, in a printed circuit board including a signal transmission line, the signal transmission line is formed by first, second and third connection patterns connected in series, and the thickness of the second connection pattern is smaller than that of the first and third connection patterns.

Thus, the second connection pattern serves as a terminating resistor of the prior art printed circuit board.

Further, in a printed circuit board including a signal transmission line having a stub section, the width of the stub section is smaller than that of the transmission line other than the stub section.

Additionally, in a printed circuit board including a signal transmission line having a stub section, the thickness of the stub section is smaller than that of the transmission line other than the stub section.

Thus, the stub section serves as a terminating resistor of the prior art printed circuit board.

BRIEF DESCRIPTION OF THE DRAWINGS

The present invention will be more clearly understood from the description as set below, as compared with the prior art, with reference to the accompanying drawings, wherein.

DESCRIPTION OF THE PREFERRED EMBODIMENTS

Figure 1A:
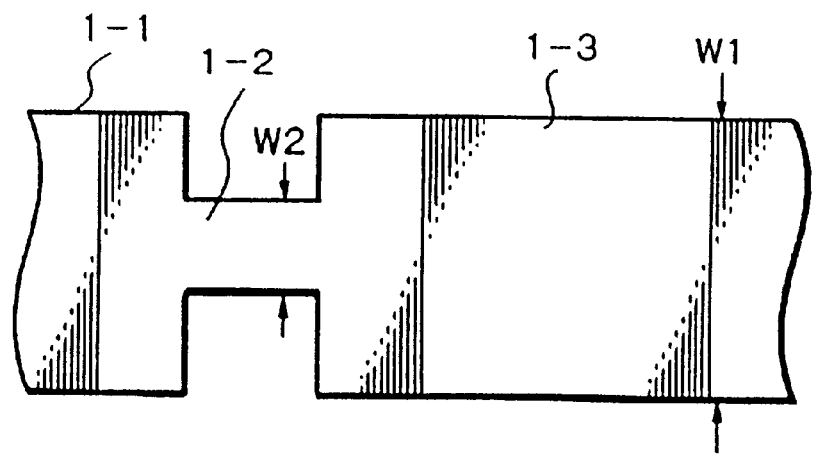
FIG. 1A is a plan view illustrating a first embodiment of the printed circuit board according to the present invention.
Figure 1B:
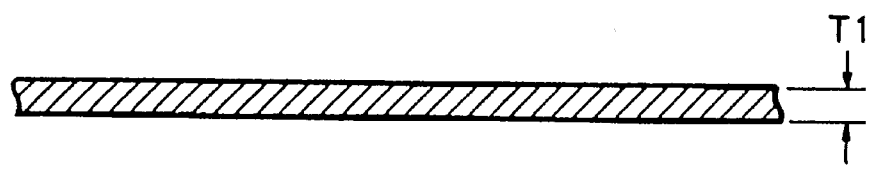
FIG. 1B is a cross-sectional view of the transmission line of FIG. 1A.

FIGS. 1A and 1B are a plan view and a cross-sectional view, respectively, illustrating a first embodiment of the present invention. That is, a signal transmission line is formed by connection patterns 1-1, 1-2 and 1-3 connected in series. The connection patterns 1-1, 1-2 and 13 have the same thickness; however, the width W2 of the connection pattern 1-2 is smaller than the width W1 of the connection patterns 1-1 and 1-3. Therefore, the DC resistance of the connection pattern 1-2 becomes larger, so that the connection pattern 1-2 serves as a terminating resistor of the prior art printed circuit board.

As illustrated in Pig. IC, the signal transmission line of FIGS. 1A and 1B is connected to a drive device 2 and a receiving device 3. The drive device 2 is formed by a bipolar transistor using an open-collector output or a MOS transistor using an open-drain output. The receiving device 3 is formed by a transistor having a definite or variable threshold input voltage.

Figure 1C:
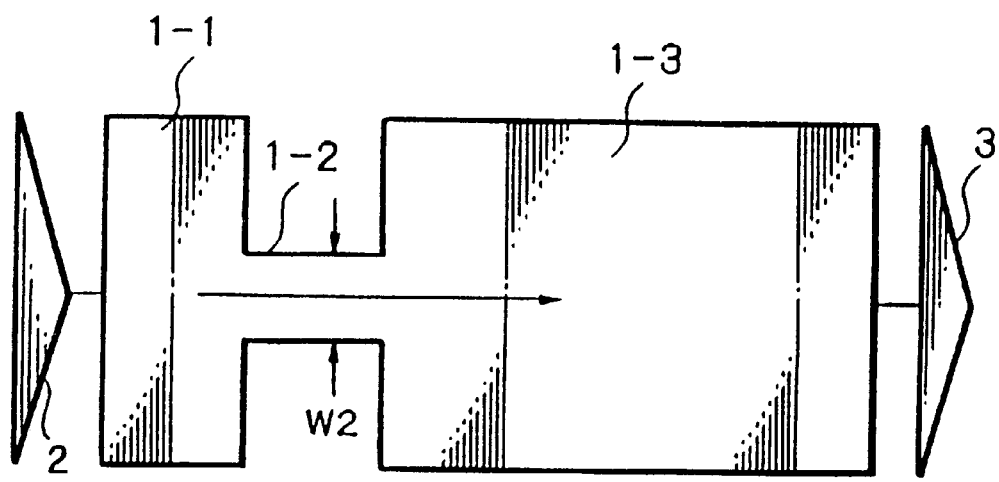
FIG. 1C is a plan view of the transmission line of FIG. 1A connected to a drive device and a receiving device.

In FIG. 1C, the width W2 of the connection pattern 1-2 is adjusted so that a reflection coefficient is regulated by the characteristic impedance of the connection patterns 1-1 and 1-3 and the resistance of the connection pattern 1-2. Thus, ringing at the input of the receiving device 3 can be suppressed, which can suppress the generation of noise.

Figure 2A:
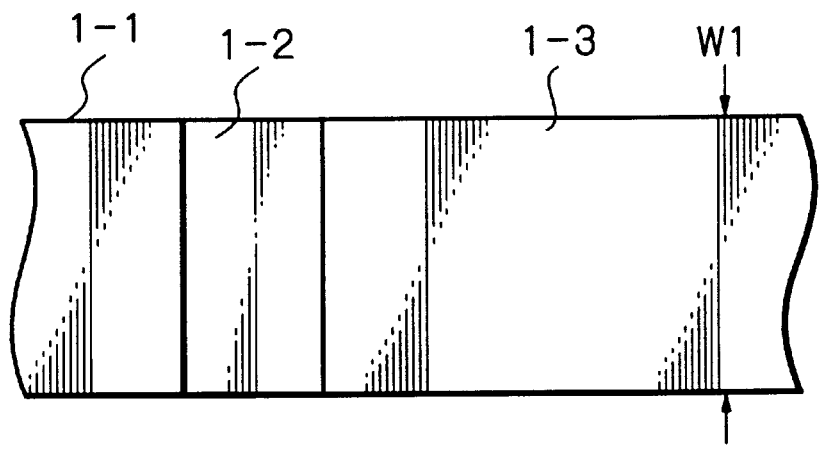
FIG. 2A is a plan view illustrating a second embodiment of the printed circuit board according to the present invention.
Figure 2B:
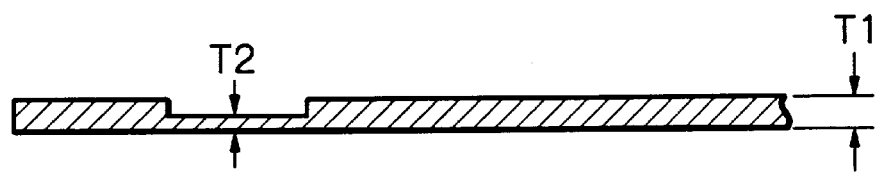
FIG. 2B is a cross-sectional view of the transmission line of FIG. 2A.

FIGS. 2A and 2B are a plan view and a cross-sectional view, respectively, illustrating a second embodiment of the present invention. That is, the connection patterns 1-1, 1-2 and 1-3 have the same width W1; however, the thickness T2 of the connection pattern 1-2 is smaller than the thickness T1 of the connection patterns 1-1 and 1-3. Therefore, the DC resistance of the connection pattern 1-2 becomes larger, so that the connection pattern 1-2 serves as a terminating resistor of the prior art printed circuit board.

Figure 2C:
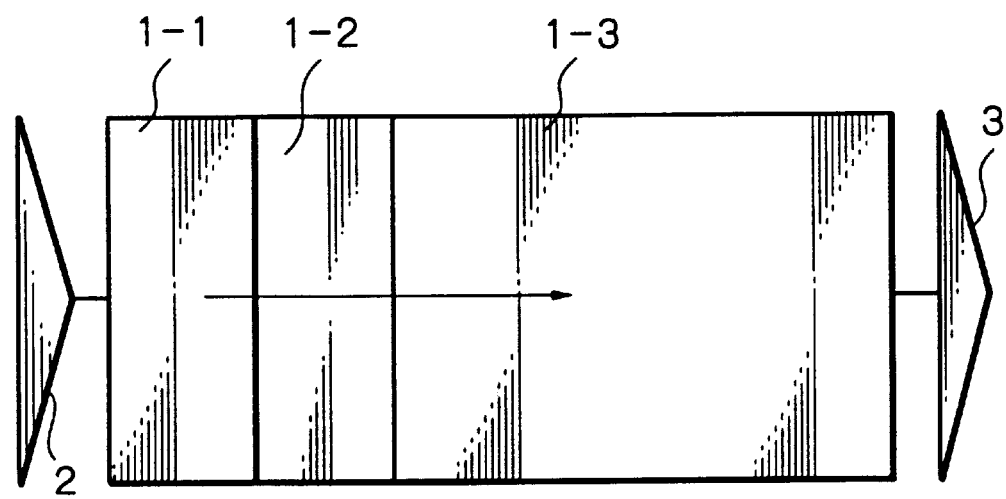
FIG. 2C is a plan view of the transmission line of FIG. 2A connected to a drive device and a receiving device.

As illustrated in FIG. 2C, in the same way as in FIG. IC, the signal transmission line of FIGS. 2A and 2B is. connected to a drive device 2 and a receiving device 3.

In FIG. 2C, the thickness T2 of the connection pattern 1-2 is adjusted so that a reflection coefficient is regulated by the characteristic impedance of the connection patterns 1-1 and 1-3 and the resistance of the connection pattern 1-2. Thus, ringing at the input of the receiving device 3 can be suppressed, which can suppress the generation of noise.

Figure 3A:
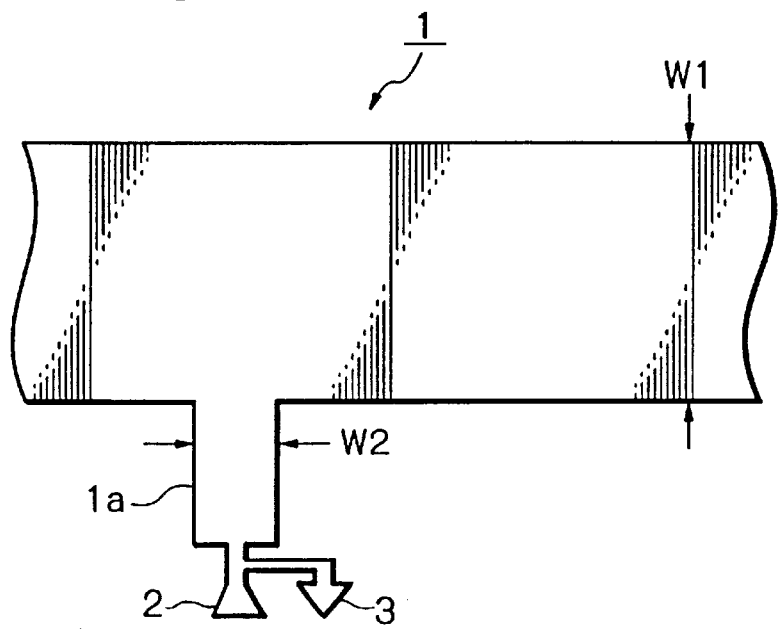
FIG. 3A is a plan view illustrating a third embodiment of the printed circuit board according to the present invention.
Figure 3B:
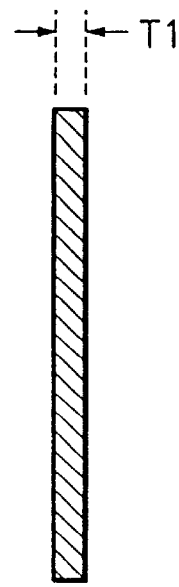
FIG. 3B is a cross-sectional view of the transmission line of FIG. 3A.

FIGS. 3A and 3B are a plan view and a cross-sectional view, respectively, illustrating a third embodiment of the present invention. That is, a signal transmission line 1 has a stub section 1a. The signal transmission line 1 including the stub section 1a has the same thickness; however, the width W2 of the stub section 1a is smaller than the width W1 of the signal transmission line 1 other than the stub section 1a. Therefore, the DC resistance of the stub section la become.s large, so that the stub section la serves as a terminating resistor of the prior art printed circuit board.

As illustrated in FIG. 3A, the stub section 1a is connected to a drive device 2 and a receiving device 3. Also, as illustrated in FIG. 3C, in the same way as in FIG. 1C, the signal transmission line of FIGS. 3A and 3B is connected to a drive device 2 and a receiving device 3.

Figure 3C:
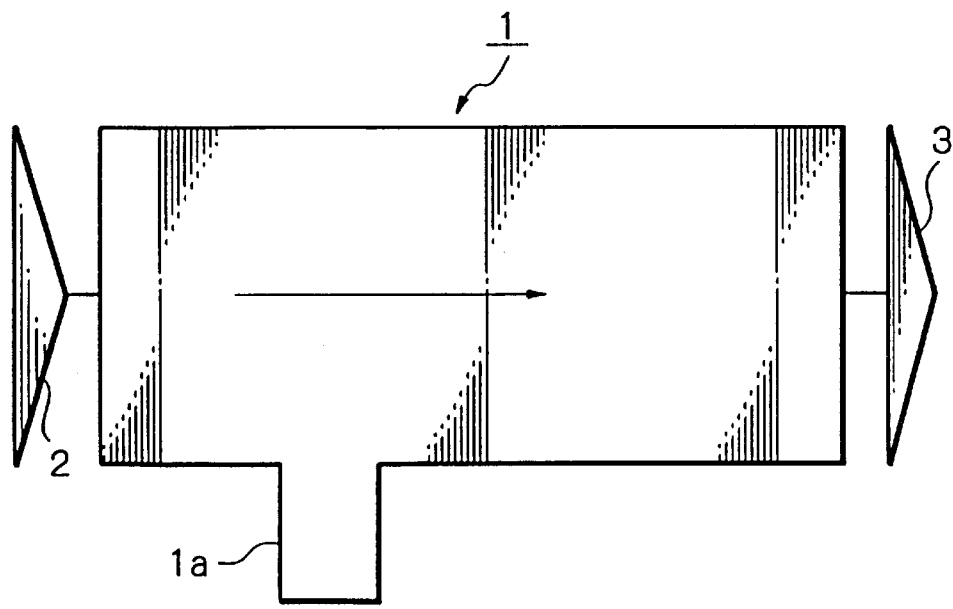
FIG. 3C. is a plan view of the transmission line of FIG. 3A connected to a drive device and a receiving device.

In FIG. 3C, the width W2 of the stub section 1a is adjusted so that a reflection coefficient is regulated by the characteristic impedance of the signal transmission line 1 other than the stub section 1a and the resistance of the stub section 1a. Thus, ringing at the input of the receiving device 3 can be suppressed, which can suppress the generation of noise.

Figure 4A:
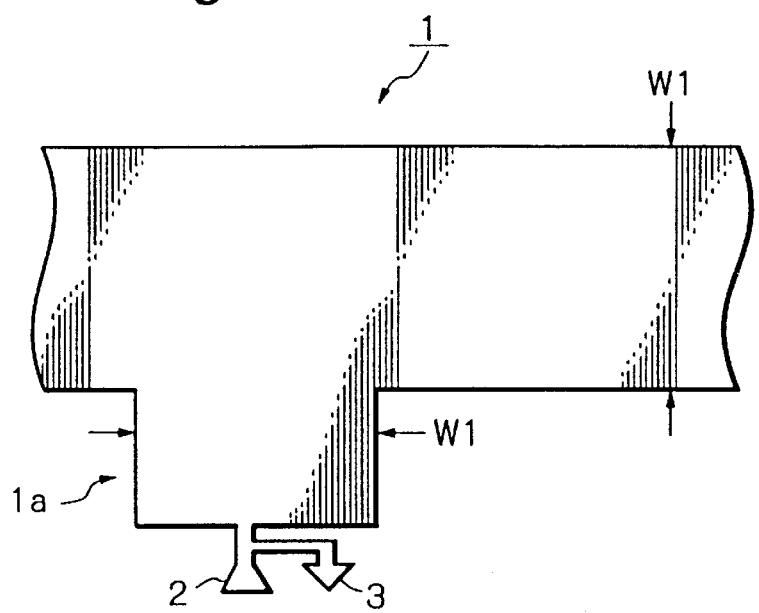
FIG. 4A is a plan view illustrating a fourth embodiment of the printed circuit board according to the present invention.
Figure 4B:
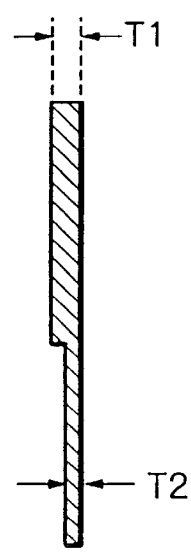
FIG. 4B is a cross-sectional view of the transmission line of FIG. 4A.

FIGS. 4A and 4B are a plan view and a cross-sectional view, respectively, illustrating a fourth embodiment of the present invention. That is, the signal transmission line 1 including the stub section 1a has the same width W1; however, the thickness T2 of the stub section 1a is smaller than the thickness T1 of the signal transmission line 1 other than the stub sectional 1a. Therefore, the DC resistance of the stub section la becomes large, so that the stub section la serves as a terminating resistor of the prior art printed circuit board.

As illustrated in FIG. 4A, the stub section 1a is connected to a drive device 2 and a receiving device 3. Also, as illustrated in FIG. 4C, in the same way as in FIG. 1C, the signal transmission line of FIGS. 4A and 4B is connected to a drive device 2 and a receiving device 3.

Figure 4C:
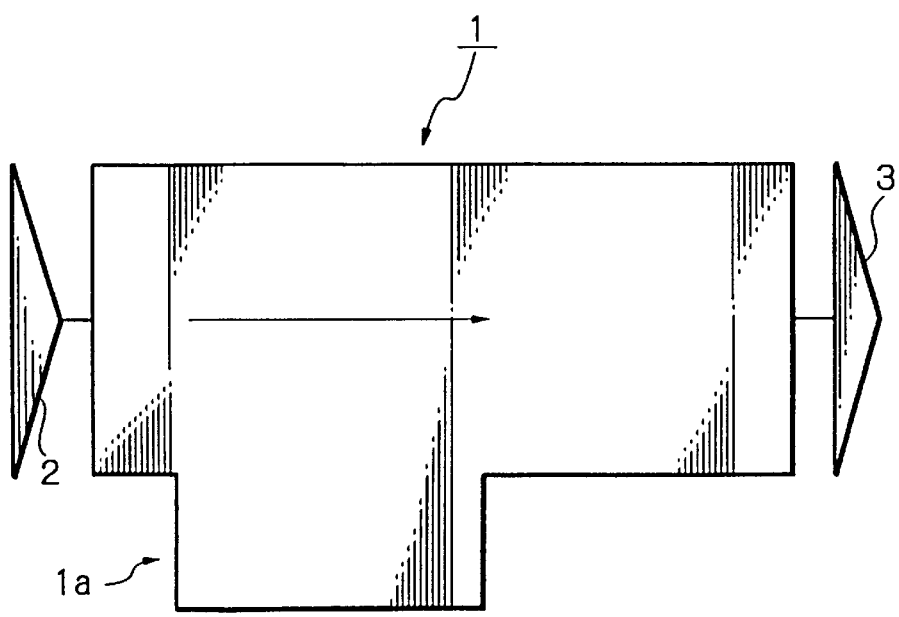
FIG. 4C is a plan view of the transmission line of FIG. 4A connected to a drive device-and a receiving device.

In FIG. 4C, the thickness T2 of the stub section 1a is adjusted so that a reflection coefficient is regulated by the characteristic impedance of the signal transmission line other than the stub section 1a and the resistance of the stub section 1a. Thus, ringing at the input of the receiving device 3 can be suppressed, which can suppress the generation of noise.

As explained hereinabove, according to the present invention, the generation of noise can be suppressed without terminating resistors.

What is claimed is:

1. A printed circuit board comprising a signal transmission line having a stub section, wherein a thickness of said stub section is smaller than a thickness of a remaining portion of said transmission line, and a width of said stub section is the same as a width of the remaining portion of said transmission line, wherein said stub section serves as a terminating resistor of said printed circuit board.

2. The printed circuit board as set forth in claim 1, wherein a first end of said signal transmission line is connected to a drive device, and a second end of said signal transmission line is connected to a receiving device.

3. The printed circuit board as set forth in claim 1, wherein said stub section is connected to a drive device and a receiving device.

\* \* \* \* \*